(12) United States Patent
Maruyama et al.

(10) Patent No.: US 9,570,335 B2
(45) Date of Patent: Feb. 14, 2017

(54) DICING FILM

(75) Inventors: Kazuhiko Maruyama, Hyogo-ken (JP); Masatoshi Isobe, Hyogo-ken (JP)

(73) Assignee: SUMITOMO BAKELITE CO., LTD., Shinagawa-ku, Tokyo (JP)

( * ) Notice: Subject to any disclaimer, the term of this patent is extended or adjusted under 35 U.S.C. 154(b) by 113 days.

(21) Appl. No.: 13/822,356

(22) PCT Filed: Sep. 13, 2011

(86) PCT No.: PCT/JP2011/070847
§ 371 (c)(1),
(2), (4) Date: Mar. 12, 2013

(87) PCT Pub. No.: WO2012/036149
PCT Pub. Date: Mar. 22, 2012

(65) Prior Publication Data
US 2013/0171449 A1   Jul. 4, 2013

(30) Foreign Application Priority Data

Sep. 13, 2010  (JP) .................................. 2010-204062
Sep. 30, 2010  (JP) .................................. 2010-220410

(51) Int. Cl.
*B32B 7/12*    (2006.01)
*H01L 21/683*  (2006.01)
(Continued)

(52) U.S. Cl.
CPC ........... *H01L 21/6836* (2013.01); *C08L 25/14* (2013.01); *C08L 53/02* (2013.01); *C08L 53/025* (2013.01);
(Continued)

(58) Field of Classification Search
CPC .......................... C09J 2425/006; C09J 2203/00
See application file for complete search history.

(56) References Cited

U.S. PATENT DOCUMENTS 5,538,771 A * 7/1996 Nakayama .............. C08L 53/02
                                                              428/345
5,539,030 A * 7/1996 Laughner ................ C08L 33/06
                                                              524/109
(Continued)

FOREIGN PATENT DOCUMENTS

EP    0 520 515         12/1992
JP    2003-257893        9/2003
(Continued)

OTHER PUBLICATIONS

Yabuki, Akira et al., "Adhesive tape for fixing semiconductor wafer", machine translation of JP 2005-248018A, Sep. 15, 2005.*
(Continued)

*Primary Examiner* — Anish Desai
(74) *Attorney, Agent, or Firm* — Amin, Turocy & Watson LLP

(57) ABSTRACT

According to the invention, a dicing film, which generates a small amount of scrapes and beard-like burrs during dicing and furthermore has desirable strength and external appearance, is provided. The dicing film according to the invention has an adhesive layer on at least one surface of a base film, wherein the base film contains a copolymer (A) of at least two kinds of alkyl(meth)acrylates and styrene; and a styrene-based elastomer (B). The copolymer (A) of at least two kinds of alkyl(meth)acrylates and styrene is a styrene-alkyl methacrylate-alkyl acrylate copolymer.

4 Claims, 1 Drawing Sheet

(51) Int. Cl.
*C09J 7/02* (2006.01)
*C09J 153/02* (2006.01)
*C08L 53/02* (2006.01)
*C08L 25/14* (2006.01)

(52) U.S. Cl.
CPC ............ *C09J 7/0267* (2013.01); *C09J 153/02* (2013.01); *C09J 2203/326* (2013.01); *C09J 2205/114* (2013.01); *C09J 2409/006* (2013.01); *C09J 2425/006* (2013.01); *C09J 2433/006* (2013.01); *H01L 2221/68327* (2013.01); *H01L 2221/68336* (2013.01); *Y10T 428/28* (2015.01)

(56) References Cited

U.S. PATENT DOCUMENTS

| | | | | |
|---|---|---|---|---|
| 6,933,343 | B2 * | 8/2005 | Ikematsu et al. | 525/98 |
| 2009/0038736 | A1 * | 2/2009 | Lorence et al. | 156/86 |
| 2010/0167172 | A1 * | 7/2010 | Imoda et al. | 429/508 |
| 2011/0039065 | A1 * | 2/2011 | Morioka et al. | 428/138 |
| 2014/0011025 | A1 * | 1/2014 | Ishiba et al. | 428/355 AC |
| 2014/0011026 | A1 * | 1/2014 | Ishiba et al. | 428/355 EN |

FOREIGN PATENT DOCUMENTS

| | | | | |
|---|---|---|---|---|
| JP | 2004-035644 | | 2/2004 | |
| JP | 2005-248018 | | 9/2005 | |
| JP | 2008-294044 | | 12/2008 | |
| WO | 2009063793 | | 5/2009 | |
| WO | WO 2009078440 | A1 * | 6/2009 | ............ C09J 7/0267 |
| WO | WO 2009119515 | A1 * | 10/2009 | ................ C09J 7/02 |

OTHER PUBLICATIONS

Material safety data sheet (MSDS) of HYBRAR (Tradename) 7125 from Kuraray America, Inc.*
Jiri George Drobny, "Handbook of Thermoplastic Elastomers", 2007, William Andrew Publishing, pp. 161-177.*
Akira Yabuki, "Adhesive Tape for Fixing Semiconductor Wafer", English translation of JP 2005-248018A, published on Sep. 15, 2005, pp. 1-20.*
A brochure titled "PSJ-Polystyrene SX100/300 Transparent Hips", from PS Japan Corporation, Apr. 1, 2012.*
Yabuki, Akira et al., "Adhesive Sheete for Bonding Wafer, and Wafer Processing Method", machine translation of JP 2009-170886A, Jul. 30, 2009.*
International Search Report for International Application No. PCT/JP2011/070847 mailed on Nov. 8, 2011.
Written Opinion for International Application No. PCT/JP2011/070847 mailed on Nov. 8, 2011.
Extended European Search Report for Application No. 11825151.1-1552/2590207 PCT/JP2011070847 Dated Jul. 21, 2014, 6 pgs.
"Safety Data Sheet (HYBRAR 7125)", Dec. 1, 2010. Retrieved from the Internet: URL: http://www.kuraray.co.jp/en/products/msds/pdf/h7125.pdf (retrieved on Jul. 10, 2014).
JSR Corporation. Material Safety Data Sheet for JSR Dynaron 1320P, Feb. 14, 2003, 6 pages. Retrieved from: https://www.b2bcomposites.com/msds/ted/73824.pdf.
Information Sheet from Shingijutsu Seminar, 2003, 5 pages. Retrieved from: https://ct.nishipla.or.jp/site/pdf/19.t_shingijutsuseminar/200301a.pdf.

* cited by examiner

DICING FILM

TECHNICAL FIELD

The present invention relates to a dicing film.

Priority is claimed on Japanese Patent Application No. 2010-204062, filed Sep. 13, 2010 and Japanese Patent Application No. 2010-220410, filed Sep. 30, 2010, the contents of which are incorporated herein by reference.

BACKGROUND ART

When semiconductor members such as a semiconductor wafer or a package are cut in the process of manufacturing a semiconductor device, a dicing film is used. The dicing film is used for picking up the semiconductor wafer and the like by bonding the semiconductor members with the dicing film to be diced (to be cut into pieces) and expanded.

Generally, a dicing film is composed of a base film and an adhesive layer. In the related art, there are many cases where a polyvinyl chloride (PVC) resin film is used as the base film. However, there are growing demands for the prevention of contamination of semiconductor members, which is caused by the attachment of a plasticizer included in the polyvinyl chloride (PVC) resin film; and related to environmental issues. Therefore, in recent years, base films using non-PVC resin-based materials such as an olefin-based resin, an ethylene vinyl alcohol-based resin, and an ethylene-methacrylic acid-acrylate-based resin have been developed (for example, refer to Patent Document 1).

In addition, along with the progress of a reduction in the size and thickness of semiconductor members in recent years, when there is a variation in the thickness accuracy of a dicing film, a problem arises in that contact manners of a dicing blade in a dicing process are different, and cracks in a semiconductor wafer are easily generated. In addition, when there is a variation in the thickness accuracy of a film, a problem arises in that semiconductor members have uncut portions or scrapes and beard-like burrs (beard-like burrs which remain on a base film after cutting and extends from a cut line of the base film) during dicing are generated and attached onto a semiconductor device. In particular, when a semiconductor package is cut, there are many cases where a dicing plate having a large thickness is used. Therefore, more significant problems arise than those caused when a semiconductor wafer is cut. In addition, after semiconductor members bonded to a dicing film are diced, the dicing film is expanded in order to enlarge a gap between the cut semiconductor members. At this time, when a base material does not have sufficient toughness, a problem arises in that a dicing film is broken. Therefore, a dicing film is required in which beard-like burrs can be suppressed during dicing and a base material is not broken during expansion.

CITATION LIST

Patent Document

[Patent Document 1] Japanese Unexamined Patent Application, First Publication No. 2003-257893

SUMMARY OF INVENTION

Technical Problem

An object of the invention is to provide a dicing film which generates a small amount of scrapes and beard-like burrs in a dicing process when a semiconductor is manufactured; and which furthermore has desirable expandability.

Solution to Problem

According to the invention, there is provided a dicing film which has an adhesive layer on at least one surface of a base film, wherein the base film contains a copolymer (A) of at least two kinds of alkyl(meth)acrylates and styrene; and a styrene-based elastomer (B).

In the dicing film according the invention, the copolymer (A) of at least two kinds of alkyl(meth)acrylates and styrene may be a styrene-alkyl methacrylate-alkyl acrylate copolymer.

In the dicing film according to the invention, the styrene-based elastomer (B) may be at least one kind of styrene-based elastomer selected from a group consisting of a hydrogenated (styrene-isoprene-styrene) copolymer, a styrene-ethylene-butylene-styrene copolymer, and a mixture thereof.

In the dicing film according to the invention, the weight ratio (A/B) of the copolymer (A) of at least two kinds of alkyl(meth)acrylates and styrene to the styrene-based elastomer (B) in the base film may be 65/35 to 45/55.

In the dicing film according to the invention, the breaking energy of the base film is greater than or equal to 15 mJ in the following evaluation test for breaking energy.

<Evaluation Test for Breaking Energy>

A cross-shaped slit is formed on a single surface of a base film, which is a test specimen, under the following slit-forming condition.

The surface on which the slit is formed is set to a lower side and a falling weight test was performed on an intersection in the cross-shaped slit under the following falling weight test condition. If the base film is broken, then the potential energy of the weight before being fallen is set as a breaking energy thereof.

<Slit-Forming Condition>

A cross shaped slit having a depth of 80 μm and a length of 40 mm or longer is formed using a blade on a base film having a thickness of 150 μm.

<Falling Weight Test Condition>

Weight: 1.02 kg

Shape of tip of weight: hemispherical shape having a diameter of 20 mm

Shape of fixed test specimen: circular shape having a diameter of 40 mm

Advantageous Effects of Invention

According to the present invention, a dicing film which generates a small amount of scrapes and beard-like burrs in a dicing process when a semiconductor is manufactured; and which has desirable expandability can be provided.

DESCRIPTION OF EMBODIMENTS

A dicing film according to the invention is used when semiconductor members, such as a semiconductor wafer or a semiconductor package, are diced (cut) mainly in the process of manufacturing a semiconductor. The dicing film is used for picking up semiconductor elements obtained by cutting a wafer using a method of, for example, bonding the dicing film to a semiconductor wafer or a semiconductor package, dicing the semiconductor wafer or the like, and expanding them.

According to the invention, as constitutional components of a base film of the dicing film, a copolymer (A) of at least two kinds of alkyl(meth)acrylates and styrene; and a styrene-based elastomer (B) are used. As a result, a design which places emphasis on the expandability of a dicing film can be made while reducing beard-like burrs caused by a resin of a base film. Hereinafter, constituent elements of the invention will be described using the drawings.

<Base Film>

Figure 1:
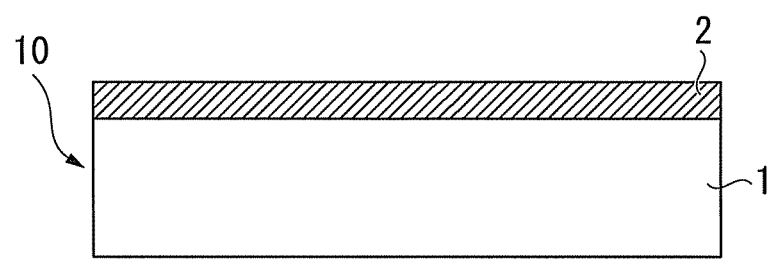
FIG. 1 is a cross-sectional view schematically illustrating an example of a dicing film according to the invention.
Figure 2:
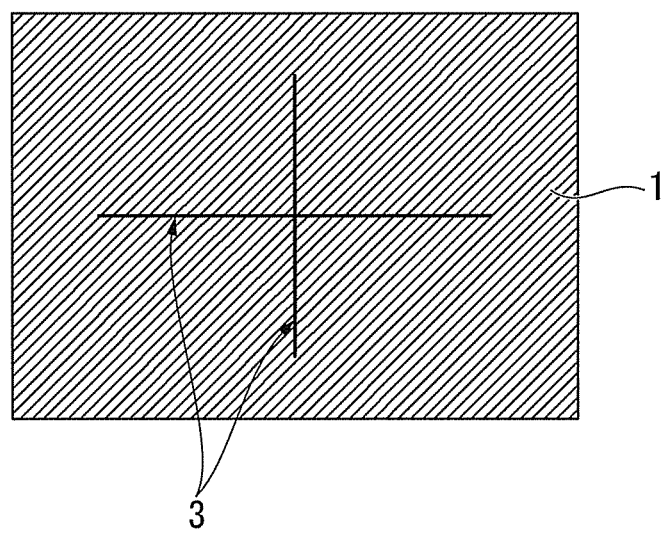
FIG. 2 is a diagram illustrating a test film according to the invention which is used for a test of evaluating breaking energy after a cross-shaped slit is formed.

A dicing film 10 according to the invention includes, as illustrated in FIG. 1, a base film 1 and an adhesive layer 2. The base film 1 contains the copolymer (A) of at least two kinds of alkyl(meth)acrylates and styrene; and the styrene-based elastomer (B). It is preferable that the copolymer (A) of at least two kinds of alkyl(meth)acrylates and styrene is a styrene-alkyl methacrylate-alkyl acrylate copolymer. By using the styrene-alkyl methacrylate-alkyl acrylate copolymer, scrapes and beard-like burrs generated during dicing can be further reduced.

Examples of the styrene-based elastomer (B) include a styrene-butadiene copolymer, a styrene-butadiene-styrene copolymer, a styrene-butadiene-butylene-styrene copolymer, a styrene-isoprene copolymer, a hydrogenated (styrene-isoprene-styrene) copolymer, and a styrene-ethylene-butylene-styrene copolymer. Among these, a hydrogenated (styrene-isoprene-styrene) copolymer is particularly preferable. By using a hydrogenated (styrene-isoprene-styrene) copolymer, the breaking strength of a base film can be further improved and furthermore, scrapes and beard-like burrs generated during dicing can be further reduced. In addition, from the same viewpoint of increasing the breaking strength of a base layer, and reducing scraps and beard-like burrs generated during dicing, a styrene-ethylene-butylene-styrene copolymer or a mixture thereof with a hydrogenated (styrene-isoprene-styrene) copolymer is preferable, and a styrene-ethylene-butylene-styrene copolymer is particularly preferable.

It is preferable that the weight ratio (A/B) of the copolymer (A) of at least two kinds of alkyl(meth)acrylates and styrene to the styrene-based elastomer (B) in the base film 1 is 65/35 to 45/55. By setting the weight ratio (A/B) of the copolymer (A) of at least two kinds of alkyl(meth)acrylates and styrene to be greater than or equal to the lower limit of the above-described range, an effect of suppressing beard-like burrs of the base film is superior; and by setting the weight ratio to be less than or equal to the upper limit of the above-described range, the breaking strength of the base film is desirable.

The dicing film, which includes both the copolymer (A) of at least two kinds of alkyl(meth)acrylates and styrene; and the styrene-based elastomer (B), is superior in suppressing beard-like burrs and is preferably used in the process of processing semiconductor members.

Furthermore, the dicing film 10 using the base film 1, which includes the copolymer (A) of at least two kinds of alkyl(meth)acrylates and styrene; and the styrene-based elastomer (B), has the following effects due to the hard and brittle characteristics of styrene. Firstly, since a styrene-based material has high modulus as a base film, gaps between chips can be further expanded in an expanding process. As a result, the risk of collision between chips during pickup can be reduced and chipping can be prevented. As a result, the reliability of semiconductor elements are improved. Secondly, delamination from a cut line is improved. The styrene-based material is brittle and has a tendency to experience a little stress during breakage. When the breaking stress is small, the stress which is applied to a base film by a dicing blade, is small and delamination occurs within a range of 20 μm to 30 μm from a cut line. Therefore, an effect of reducing water infiltrated through a delaminated portion is obtained. When delamination occurs, chip edges are contaminated. By reducing delamination, the reliability of semiconductor elements can be improved.

In addition, various resins, additives, and the like can be added to the base film of the dicing film according to the invention according to the purpose within a range not impairing the effects of the invention. For example, in order to impart antistatic properties, a polymer type antistatic agent such as a polyether/polyolefin block polymer or a polyether ester amide block polymer; or carbon black can be added thereto. In particular, when an antistatic effect is imparted, an ion-conductive antistatic agent using a polyether/polyolefin copolymer is preferable from the viewpoint of compatibility with an olefin-based resin. In addition, the fracture elongation can be increased by adding an elastomer.

The thickness of a base film of a dicing film for dicing a semiconductor wafer is preferably 50 μm to 150 μm and more preferably 70 μm to 100 μm. In addition, the thickness of a base film of a dicing film for dicing a special member such as a semiconductor package is preferably 100 μm to 300 μm and more preferably 150 μm to 200 μm. By setting the thickness to be greater than or equal to the lower limit of the above-described range, it is difficult for the base film to be broken during expansion. By setting the thickness to be less than or equal to the upper limit of the above-described range, beard-like burrs generated during dicing can be suppressed.

According to the dicing film of the invention, in order to easily pick up semiconductor members after dicing, a dicing film, bonded to the semiconductor members after dicing, is expanded, thereby expanding gaps between the semiconductor members (chips). In order to obtain desirable expandability, it is preferable that the breaking energy of the base film be greater than or equal to 15 mJ in the following evaluation test for breaking energy. By setting the breaking energy to be greater than or equal to the lower limit, the breakage during expansion can be suppressed. The breaking energy can be appropriately adjusted by changing the mixing ratio of an elastomer in the base film. For example, the breaking energy can be increased by, for example, mixing an elastomer thereinto.

<Evaluation Test for Breaking Energy>

A cross-shaped slit is formed on a single surface of a base film, which is a test specimen, under the following slit-forming condition.

The surface on which the slit is formed is set to a lower side and a falling weight test was performed on an intersection in the cross-shaped slit under the following falling weight test condition. If the base film is broken, then the potential energy of the weight before being fallen is set as a breaking energy thereof.

<Slit-Forming Condition>

A cross shaped slit having a depth of 80 μm and a length of 40 mm or longer is formed using a blade on a base film having a thickness of 150 μm.

<Falling Weight Test Condition>
Weight: 1.02 kg
Shape of tip of weight: hemispherical shape having a diameter of 20 mm
Shape of fixed test specimen: circular shape having a diameter of 40 mm
(Adhesive Layer)

As illustrated in FIG. 1, at least one surface of the base film 1 of the dicing film 10 according to the invention is provided with an adhesive layer 2. Examples of a resin composition used for the adhesive layer 2 include an acrylic adhesive, a UV-curable urethane acrylate resin, and an isocyanate-based cross-linking agent. Among these, it is preferable that an acrylic adhesive having a polar group be used in order to suppress the scattering of cut ends and chipping. As the acrylic adhesive, for example, butyl acrylate having a carboxyl group is preferable. The butyl acrylate having a carboxyl group is particularly preferably used from the viewpoints of mounting semiconductor members and suppressing the scattering of cut ends and chipping.

The thickness of the adhesive layer 2 is preferably 3 μm to 100 μm. The thickness of the adhesive layer 2 of a dicing film for dicing a semiconductor wafer is preferably 3 μm to 10 μm. In addition, the thickness of the adhesive layer 2 of a dicing film for dicing a special member such as a package is preferably 10 μm to 30 μm. By setting the thickness of the adhesive layer 2 to be greater than or equal to the lower limit of the above-described range, the strength for holding an adherend is superior. In addition, by setting the thickness of the adhesive layer 2 to be less than or equal to the upper limit of the above-described range, a dicing film having superior workability during dicing can be obtained.

<Example of Method of Manufacturing Dicing Film>

In order to form the adhesive layer 2 of the dicing film 10 according to the invention, a coating solution obtained by appropriately dissolving or dispersing a resin, used as the adhesive layer 2 in a solvent is used. The base film 1 or a resin film containing the base film 1 is coated with the above-described coating solution according to a well-known method such as roll coating or gravure coating, followed by drying, to form the adhesive layer 2.

The dicing film according to the invention can be provided with other resin layers according to the purpose within a range not impairing the effects of the invention.

[Examples]

The invention will be described in further detail with reference to examples. However, these are merely examples and the invention is not limited thereto.

<Preparation of Base Film>

The following raw materials were mixed with a dry blender according to each mixing ratio by weight as shown in Tables 1 and 2, followed by extruding with a φ50 mm extruder (L/D=25, UNIMELT pin screw, screw compression ratio: 2.9) for film formation under conditions of a width of a coat hanger die of 300 mm (lip gap=0.5 mm) and an extrusion temperature of 220° C. (at the tip of a screw) to obtain a sheet (base film) having a thickness of 150 μm.

<Raw Materials Used for Base Films of Examples/Comparative Examples>

Styrene-alkyl methacrylate-alkyl acrylate copolymer SX100 (manufactured by PS Japan Corporation)
Polystyrene HF77 (manufactured by PS Japan Corporation)
Polypropylene FS2011C (manufactured by Sumitomo Chemical Co., Ltd.)
Hydrogenated (styrene-isoprene-styrene) copolymer HYBRAR 7125 (manufactured by Kuraray Co., Ltd.)
Styrene-ethylene-butylene-styrene copolymer SEPTON 8007 (manufactured by Kuraray Co., Ltd.)

<Preparation of Adhesive Layer>

30% by weight of 2-ethylhexyl acrylate, 69% by weight of vinyl acetate, and 1% by weight of 2-hydroxyethyl methacrylate were solution-polymerized in a toluene solvent to obtain a base resin having a weight average molecular weight of 150,000. With respect to 100 parts by weight of the base resin, 100 parts by weight of bifunctional urethane acrylate (manufactured by Mitsubishi Rayon Co., Ltd., weight average molecular weight: 11,000) as a energy ray curable resin; 15 parts by weight of polyol adduct of tolylene diisocyanate (CORONATE L, manufactured by Nippon Polyurethane Industry Co., Ltd.) as a cross-linking agent; and 5 parts of 2,2-dimethoxy-2-phenylacetophenone as an energy ray polymerization initiator were dissolved in ethyl acetate. A polyester film (thickness: 38 μm), subjected to delamination treatment, was coated with these dissolved resins such that the thickness of a dried adhesive layer was 20 followed by drying at 80° C. for 5 minutes to obtain an adhesive layer.

<Preparation of Dicing Film>

The above-described adhesive layer was laminated at 30° C. using a laminate roll onto the base film having a thickness of 150 μm obtained according to each mixing ratio by weight shown in Tables 1 and 2, to thereby obtain a dicing film.

The obtained dicing film was evaluated based on the following items:

<1> Occurrence of Beard-Like Burrs

The obtained dicing film was bonded to a silicon mirror wafer (bonding to a mirror surface). After bonding, the resultant was left to stand for 20 minutes and was diced under the following dicing condition 1. The dicing film after dicing was irradiated with UV rays under the following UV irradiation condition 1 to delaminate the silicon mirror wafer, and then the diced cut line was observed with a microscope. Regarding arbitrary 10 chips (5×2) neighboring each other, scrapes (beard-like burrs) in the vicinity of each cut line were observed with a microscope (25 times). As a result, cases where the total number of beard-like burrs was 2 or less are represented by the symbol ⓒ, cases where the total number of beard-like burrs was 3 to 5 are represented by the symbol O, cases where the total number of beard-like burrs was 6 to 10 are represented by the symbol Δ, and cases where the total number of beard-like burrs was 11 or more are represented by the symbol X.

<Dicing Condition 1>
Dicing blade: NBC-ZH2050-SE 27HEDD (manufactured by Disco Corporation)
Rotating speed of blade: 30,000 rpm
Cut speed: 50 mm/sec
Sample cut size: 5 mm×5 mm
Blade height: 75 μm
Usage of 6 inch ring/semiconductor wafer (thickness: 400 μm)

<UV Irradiation Condition 1>
Illuminance: 65 mW/cm$^2$
Integral of light: 200 mJ/cm$^2$
UV lamp: high-pressure mercury lamp H03-L21, 80 W/cm (manufactured by Eye Graphics Co., Ltd.)
UV illuminometer: UV-PFA1 (manufactured by Eye Graphics Co., Ltd.)

<2> Expandability

The dicing film prepared under the above-described conditions was diced under the following dicing condition 2. Then, UV irradiation was performed under the following UV irradiation condition 2 and expansion was performed under the following expansion condition 1. As a result, cases where the film was not broken are represented by the symbol O and cases where the film was not broken are represented by X.
<Dicing Condition 2>
Dicing blade: NBC-ZH2050-SE 27HEDD (manufactured by Disco Corporation)
Rotating speed of blade: 30,000 rpm
Cut speed: 50 mm/sec
Sample cut size: 5 mm×5 mm
Blade height: 75 μm
Usage of 6 inch ring/semiconductor wafer (thickness: 400 μm)
<UV Irradiation Condition 2>
Illuminance: 65 mW/cm$^2$
Integral of light: 200 mJ/cm$^2$
UV lamp: high-pressure mercury lamp H03-L21, 80 W/cm (manufactured by Eye Graphics Co., Ltd.)
UV illuminometer: UV-PFA1 (manufactured by Eye Graphics Co., Ltd.)
<Expansion Condition 1>
Amount of Expansion: 5 mm
Usage of 8 inch ring
<3> Breaking Energy
The base film was diced in a cross-shape under the following dicing condition 3. A cut line was set to a lower side and a falling weight test was performed on an intersection in the cross-shape cut line from the back surface of the base film under the following falling weight test condition 1. If the base film was broken, then the potential energy of the weight before being fallen was measured and set as a breaking energy thereof.
<Dicing Condition 3>
Dicing blade: NBC-ZH2050-SE 27HEDD (manufactured by Disco Corporation)
Rotating speed of blade: 40,000 rpm
Cut speed: 100 mm/sec
Blade height: 80 μm
Sample cut size: 70 mm×60 mm
Usage of 6 inch ring
<Falling Weight Test Condition 1>
Weight: 1.02 kg
Shape of tip of weight: hemispherical shape having a diameter of 20 mm
Shape of fixed test specimen: circular shape having a diameter of 40 mm
<4> Distance between Chips During Expansion
The dicing films of Example 1 and Comparative Example 5 were bonded to a 4 inch wafer, were diced under the following dicing condition 4, and were irradiated with UV rays under the following UV irradiation condition 3. Then, expansion was performed under the following expansion condition 2. In the expanded state, 5 arbitrary points of distances between chips were measured and the average thereof was set as the distance between chips.
<Dicing Condition 4>
Dicing blade: NBC-ZH2050-SE 27HEDD (manufactured by Disco Corporation)
Rotating speed of blade: 40,000 rpm
Cut speed: 50 m/min
Amount of base material cut: 35 μm from adhesive layer
Sample cut size: 10 mm×10 mm
<UV Irradiation Condition 3>
Illuminance: 65 mW/cm$^2$
Integral of light: 200 mJ/cm$^2$
UV lamp: high-pressure mercury lamp H03-L21, 80 W/cm (manufactured by Eye Graphics Co., Ltd.)
UV illuminometer: UV-PFA1 (manufactured by Eye Graphics Co., Ltd.)
<Expansion Condition 2>
Amount of Expansion: 5 mm
<5> Delamination of Chip Cut Line Portion
The dicing films of Example 1 and Comparative Example 5 were bonded to a 4 inch wafer, were diced under the following dicing condition 5, and were irradiated with UV rays under the following UV irradiation condition 4. Then, chips were delaminated from the base film and a cut line was observed with a microscope to measure the sizes of portions delaminated from end portions of the cut line.
<Dicing Condition 5>
Dicing blade: NBC-ZH2050-SE 27HEDD (manufactured by Disco Corporation)
Rotating speed of blade: 40,000 rpm
Cut speed: 50 m/min
Amount of base material cut: 35 μm from adhesive layer
Sample cut size: 10 mm×10 mm
<UV Irradiation Condition 4>
Illuminance: 65 mW/cm$^2$
Integral of light: 200 mJ/cm$^2$
UV lamp: high-pressure mercury lamp H03-L21, 80 W/cm (manufactured by Eye Graphics Co., Ltd.)
UV illuminometer: UV-PFA1 (manufactured by Eye Graphics Co., Ltd.)
The evaluation results of the above-described Examples and Comparative Examples are shown in Tables 1 and 2. All the Examples 1 to 6 showed superior results in which beard-like burrs were suppressed. In addition, superior results for the expandability of the base film were shown. On the other hand, Comparative Examples 2, 4, and 5 showed results in which beard-like burrs were not suppressed; and Comparative Examples 1 and 3 showed results in which the base film having sufficient expandability was not obtained. In addition, when Example 1 was compared to Comparative Example 5, the distance between chips during expansion could be increased. Furthermore, delamination was not observed at cut line portions of chips in Example 1, whereas delamination was observed in Comparative Example 5.

TABLE 1

| Raw Materials | Product Name | Example 1 | Example 2 | Example 3 | Example 4 | Example 5 | Example 6 |
|---|---|---|---|---|---|---|---|
| Styrene-Alkyl Methacrylate-Alkyl Acrylate Copolymer | SX100 | 65 | 45 | 65 | 45 | 65 | 45 |
| Polystyrene | HF77 | | | | | | |
| Hydrogenated (Styrene-Isoprene-Styrene) Copolymer | HYBRAR 7125 | 35 | 55 | | | 15 | 25 |
| Styrene-Ethylene-Butylene-Styrene Copolymer | SEPTON 8007 | | | 35 | 55 | 20 | 30 |

TABLE 1-continued

| Raw Materials | Product Name | Example 1 | Example 2 | Example 3 | Example 4 | Example 5 | Example 6 |
|---|---|---|---|---|---|---|---|
| Evaluation Results | Breaking Energy (mJ) | 25 | 200 | 15 | 25 | 20 | 40 |
| | Beard-Like Burrs | ○ | ○ | ◎ | ◎ | ○ | ○ |
| | Expansion | ○ | ○ | ○ | ○ | ○ | ○ |
| | Distance between Chips | 80 μm | — | — | — | — | — |
| | Delamination of Cut line | None | — | — | — | — | — |

TABLE 2

| Raw Materials | Product Name | Comparative Example 1 | Comparative Example 2 | Comparative Example 3 | Comparative Example 4 | Comparative Example 5 |
|---|---|---|---|---|---|---|
| Styrene-Alkyl Methacrylate-Alkyl Acrylate Copolymer | SX100 | | | | | |
| Polystyrene | HF77 | 65 | 45 | 65 | 45 | |
| Polypropylene | FS2011C | | | | | 65 |
| Hydrogenated (Styrene-Isoprene-Styrene) Copolymer | HYBRAR 7125 | 35 | 55 | | | 35 |
| Styrene-Ethylene-Butylene-Styrene Copolymer | SEPTON 8007 | | | 35 | 55 | |
| Evaluation Results | Breaking Energy (mJ) | 10 | 80 | 5 | 45 | 45 |
| | Beard-Like Burrs | ○ | X | ◎ | Δ | X |
| | Expansion | X | ○ | X | ○ | ○ |
| | Distance between Chips | — | — | — | — | 63 μm |
| | Delamination of Cut line | — | — | — | — | 30 μm |

INDUSTRIAL APPLICABILITY

The dicing film according to the invention generates a small amount of scrapes and beard-like burrs during dicing and has desirable strength and external appearance as a dicing film; and therefore is desirably used as a film for fixing semiconductor members in a dicing process when a semiconductor device is manufactured.

REFERENCE SIGNS LIST 1 base film
2 adhesive layer
3 slit
10 dicing film

The invention claimed is:

1. A method for using a dicing film which has an adhesive layer on at least one surface of a base film in a dicing process for manufacturing a semiconductor,
wherein the base film consists of a copolymer (A) of at least two kinds of alkyl (meth)acrylates and styrene; and a styrene-based elastomer (B);
wherein the copolymer (A) of at least two kinds of alkyl (meth)acrylates and styrene is a styrene-alkyl methacrylate-alkyl acrylate copolymer;
wherein the styrene-based elastomer (B) is a hydrogenated styrene-isoprene-styrene copolymer; and
wherein the weight ratio (NB) of the copolymer (A) of at least two kinds of alkyl (meth)acrylates and styrene to the styrene-based elastomer (B) in the base film is 65/35 to 45/55.

2. The method for using a dicing film according to claim 1,
wherein a breaking energy of the base film is greater than or equal to 15 mJ, wherein the breaking energy is determined by an evaluation test, the evaluation test comprising:
forming a cross-shaped slit on a single surface of the base film, the cross-shaped slit having a depth of 80 μm and a length of at least 40 mm, the base film having a thickness of 150 μm, wherein the single surface is set to a lower side;
performing a falling weight test on an intersection in the cross-shaped slit using: a weight of 1.02 kg having a hemispherical shape with a diameter of 20 mm, and the base film having a circular shape with a diameter of 40 mm; and
determining the breaking energy based on whether the base film is broken by the falling weight and the potential energy of the weight before falling.

3. The method for using dicing film according to claim 1,
wherein the adhesive layer contains an acrylic adhesive having a polar group.

4. The method for using a dicing film according to claim 1,
wherein the adhesive layer contains butyl acrylate having a carboxyl group.

* * * * *